United States Patent
Sung

(10) Patent No.: US 9,282,595 B1
(45) Date of Patent: Mar. 8, 2016

(54) LIGHTING MODULE AND LIGHTING DEVICE INCLUDING THE SAME

(71) Applicant: Ultimate Image Corporation, Miaoli (TW)

(72) Inventor: Chih-Feng Sung, Miaoli (TW)

(73) Assignee: Ultimate Image Corporation, Miaoli (TW)

( * ) Notice: Subject to any disclaimer, the term of this patent is extended or adjusted under 35 U.S.C. 154(b) by 0 days.

(21) Appl. No.: 14/574,514

(22) Filed: Dec. 18, 2014

(51) Int. Cl.
  *H01J 1/62* (2006.01)
  *H05B 33/06* (2006.01)
  *H05B 33/14* (2006.01)

(52) U.S. Cl.
  CPC ............... *H05B 33/06* (2013.01); *H05B 33/14* (2013.01)

(58) Field of Classification Search
  CPC .............................. H01B 33/06; H01B 33/14

USPC .......................... 313/504, 506, 500
See application file for complete search history.

(56) References Cited

U.S. PATENT DOCUMENTS 5,932,965 A * 8/1999 Berggren ............... C09K 11/06
  313/500

* cited by examiner

*Primary Examiner* — Vip Patel
(74) *Attorney, Agent, or Firm* — Trop Pruner & Hu, P.C.

(57) ABSTRACT

A lighting module includes spaced-apart first and second plates, an electroluminescence element disposed in an enclosed space formed between the first and second plates, multiple electrodes and multiple conducting elements. Each electrode has an inner portion electrically connected to the electroluminescence element, and an outer portion disposed in a surrounding space surrounding the enclosed space. Each conducting element is disposed in the surrounding space, and electrically contacts the outer portion of a respective electrode. The conducting elements are exposed outwardly from at least one of the first and second plates. The second plate has a normal projection that falls on and substantially corresponds in size to the first plate.

14 Claims, 5 Drawing Sheets

LIGHTING MODULE AND LIGHTING DEVICE INCLUDING THE SAME

FIELD OF THE INVENTION

This invention relates to a lighting module and a lighting device, more particularly to a lighting module having larger effective lighting area and a lighting device including the lighting module.

BACKGROUND OF THE INVENTION

Referring to FIG. 1, a conventional OLED (organic light-emitting diode) lighting device 1 utilizes includes a housing 11 and at least one lighting module 12 disposed in the housing 11.

Referring further to FIGS. 2 and 3, the lighting module 12 includes a light-transmissible first plate 121, a second plate 122, an electroluminescence element 125 and a plurality of electrodes 126.

The first plate 121 and the second plate 122 are rectangular glass plates. The first plate 121 has an area larger than that of the second plate 122. An encapsulant 129 is disposed about a periphery of the second plate 122 to connect the second plate 122 to the first plate 121, and to cooperate with the second plate 122 and the first plate 121 to define an enclosed space 123. The first plate 121 has a periphery region 124 that surrounds the encapsulant 129 and the enclosed space 123.

The electroluminescence element 125 is an OLED disposed in the enclosed space 123 and generates light that passes through the first plate 121 when supplied with electric power.

Each of the electrodes 126 has an inner portion 127 electrically connected to the electroluminescence element 125, and an outer portion 128 extending from the inner portion 127 and along the periphery region 124 for electrical connection with an external power source (not shown). The plurality of electrodes 126 supply electric power to the electroluminescence element 125 when connected to the external power source.

The purpose of providing the first plate 121 with the periphery region 124 is to hold the outer portion 128 of each of the electrodes 126 while considering the structural symmetry of the lighting module 12. However, a ratio of a lighting area (i.e., area of the electroluminescence element 125) to an overall area of the lighting module 12 (i.e., area of the first plate 121) is thus rather small. Therefore, not only does the lighting module 12 have a relatively inferior effective lighting area, but the overall size of the lighting device 1 is also relatively large due to the presence of the periphery region 124. Moreover, during manufacture or transportation of the lighting device 1, the periphery region 124 is likely to be damaged due to collision with other objects, thereby resulting in a decrease in manufacturing yield.

Therefore, it is required in the art to provide a lighting device with improved effective lighting area and manufacturing yield.

SUMMARY OF THE INVENTION

Therefore, an object of the present invention is to provide a lighting module and a lighting device that can alleviate at least one of the drawbacks associated with the abovementioned prior art.

According to a first aspect of the present invention, there is provided a lighting module that includes a first plate, a second plate spacedly confronting and being connected to the first plate, an enclosed space formed between the first and second plates, a surrounding space surrounding the enclosed space between the first and second plates, an electroluminescence element disposed in the enclosed space to generate light, a plurality of electrodes, and a plurality of conducting elements. The second plate has a normal projection that falls on and substantially corresponds in size to the first plate. Each of the electrodes has an inner portion that is electrically connected to the electroluminescence element within the enclosed space, and an outer portion that is disposed in the surrounding space. Each of the conducting elements is disposed in the surrounding space, and electrically contacts the outer portion of a respective one of the electrodes. The conducting elements are exposed outwardly from at least one of the first and second plates for connection with an external power source.

According to a second aspect of the present invention, there is provided a lighting device that includes a housing and at least one abovementioned lighting module. The lighting module is disposed in the housing.

BRIEF DESCRIPTION OF THE DRAWINGS

Other features and advantages of the present invention will become apparent in the following detailed description of the embodiments with reference to the accompanying drawings, of which.

DETAILED DESCRIPTION OF THE EXEMPLARY EMBODIMENTS

Figure 1:
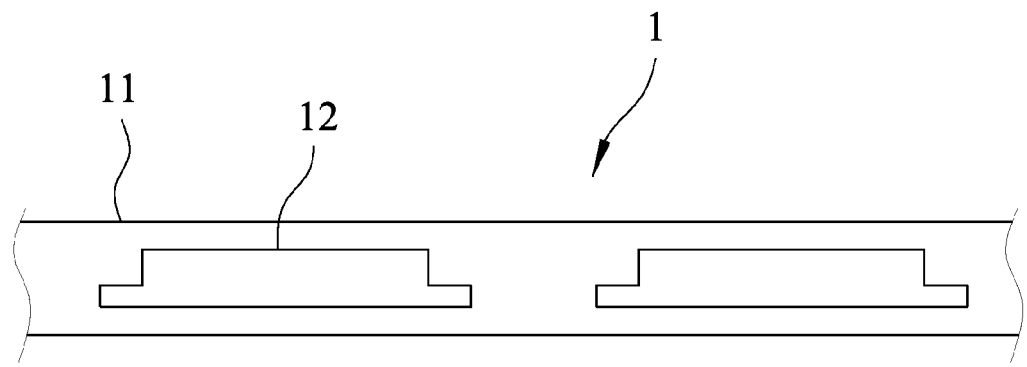
FIG. 1 is a fragmentary schematic view of a conventional lighting device including a plurality of lighting modules.

Before the present invention is described in greater detail with reference to the accompanying embodiments, it should be noted herein that like elements are denoted by the same reference numerals throughout the disclosure.

Figure 4:
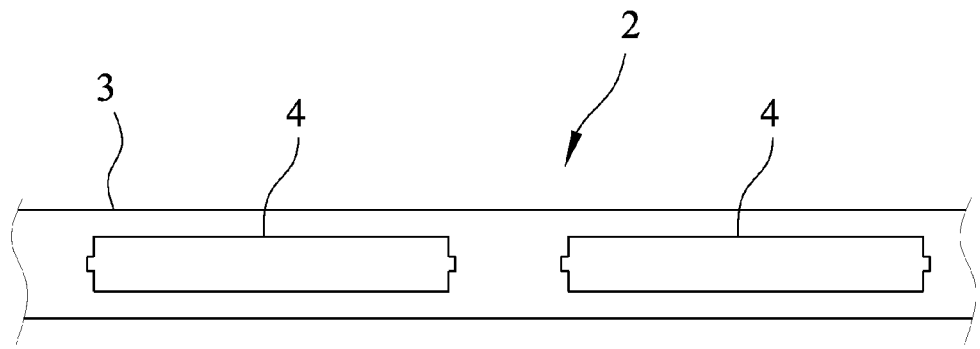
FIG. 4 is a fragmentary schematic view showing an exemplary structure of a lighting device according to the present invention.

FIG. 4 shows an exemplary structure of a lighting device 2 according to the present invention. The lighting device 2 includes a housing 3 and a plurality of lighting modules 4 disposed in the housing 3. The lighting modules 4 could emit light when supplied with electrical power by an external power source.

Figure 5:
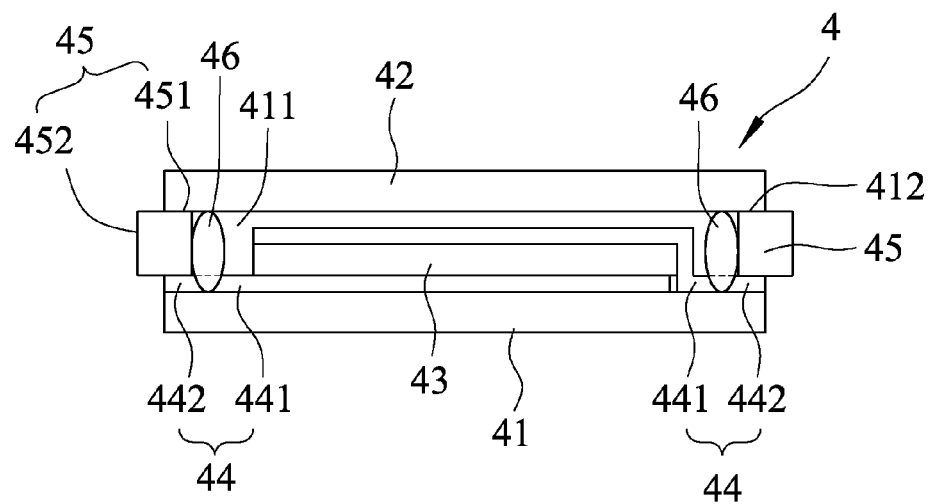
FIG. 5 is a schematic view showing a first embodiment of a lighting module included in the lighting device of FIG. 4.
Figure 6:
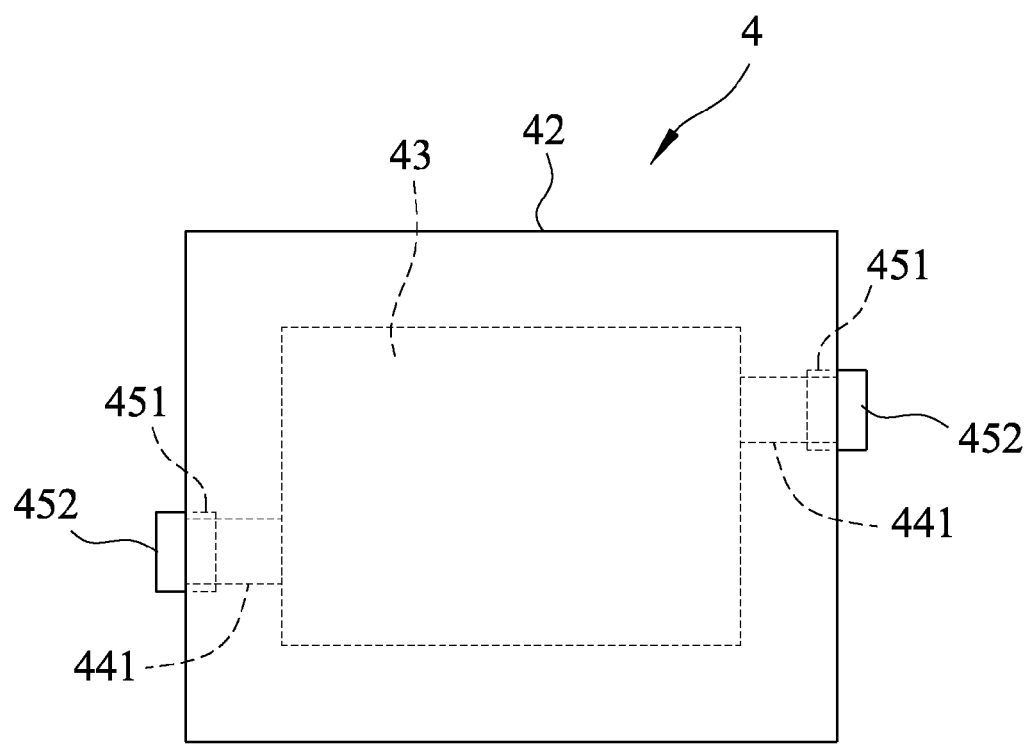
FIG. 6 is a top view of the first embodiment.

Referring to FIGS. 5 and 6, a first embodiment of each of the lighting modules 4 includes a first plate 41, a second plate 42, an electroluminescence element 43, two electrodes 44 and two conducting elements 45.

The first plate 41 has a shape and a dimension identical to that of the second plate 42. The second plate 42 spacedly confronts and is connected to the first plate 41 by an encapsulant 46 and has a normal projection that falls entirely on and substantially corresponds in shape and size to the first plate 41. The lighting module 4 further includes an enclosed space 411 and a surrounding space 412. The enclosed space 411 is defined cooperatively by the first plate 41, the second plate 42 and the encapsulant 46. The surrounding space 412 surrounds the encapsulant 46 and the enclosed space 411 between the first and second plates 41, 42.

The electroluminescence element 43 includes an OLED and is disposed in the enclosed space 411 for generating light when supplied with electric power.

The electrodes 44 are respectively cathode and anode that cooperate with each other to provide the electric power to the electroluminescence element 43 when connected to the external power source. Each of the electrodes 44 has an inner portion 441 that is electrically connected to the electroluminescence element 43 within the enclosed space 411, and an outer portion 442 that is disposed in the surrounding space 412.

Each of the conducting elements 45 is solidified silver paste that is disposed at least partially in the surrounding space 412. In this embodiment, each of the conducting elements 45 has a main portion 451 and a projecting portion 452. The main portion 451 is disposed in the surrounding space 412 and is electrically connected to the outer portion 442 of a respective one of the electrodes 44. The projecting portion 452 projects from the first and second plates 41, 42 outwardly of the surrounding space 412 (i.e., is exposed outwardly from the first and second plates 41, 42), and may be electrically connected to the external power source for providing the electric power to the electroluminescence element 43.

When the projecting portion 452 of each of the conducting elements 45 is electrically connected to the external power source, electric current flows through the projecting portion 452 to the main portion 451, the outer portion 442 of the respective one of the electrodes 44, the inner portion 441 of the respective one of the electrodes 44, and finally to the electroluminescence element 43, so that the electroluminescence element 43 generates light that passes through the first plate 41.

Figure 2:
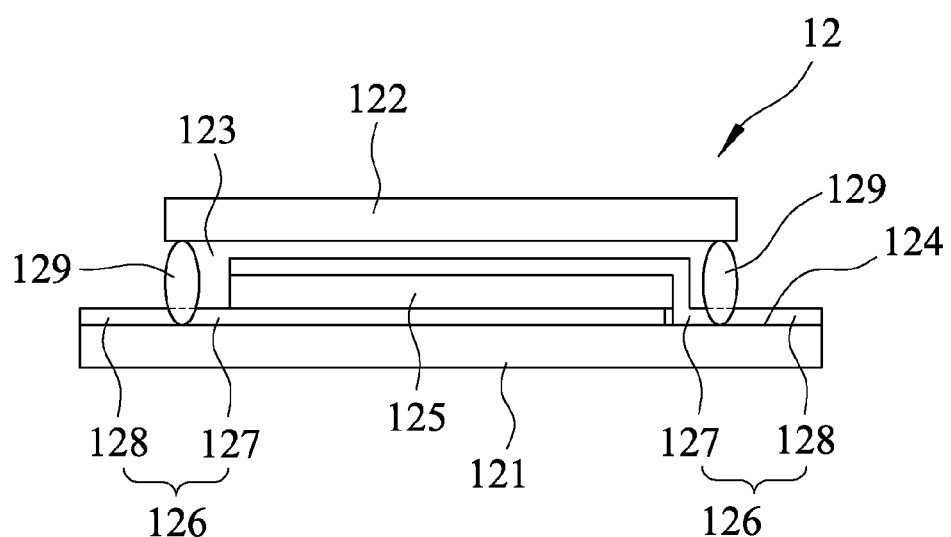
FIG. 2 is a schematic view showing one of the lighting modules included in the conventional lighting device of FIG. 1.
Figure 3:
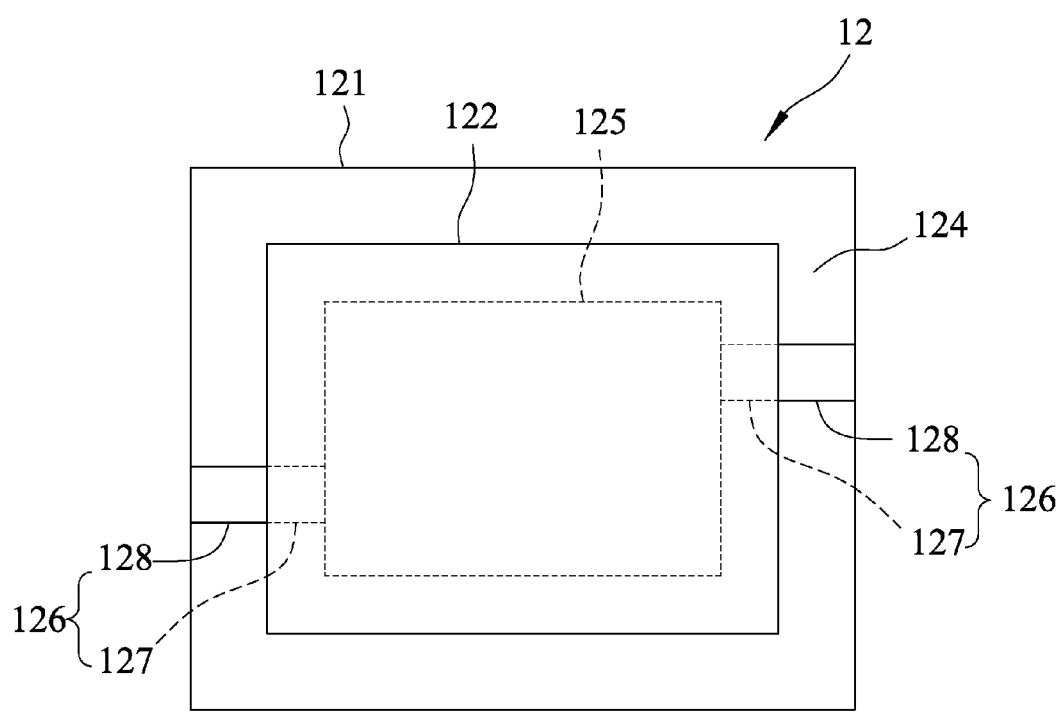
FIG. 3 is a top view of the lighting module of FIG. 2.

With the structure of each of the conducting elements 45 so configured as discussed above, a periphery region as provided in the conventional lighting module 12 (see FIG. 2) is not required in the first embodiment while electrical connection with the external power source is still achievable. The first and second plates 41, 42 could thus be designed to have exactly the same dimension to maintain structural symmetry. A ratio of a lighting area (i.e., area of the electroluminescence element 43) to an overall area of the lighting module 4 (i.e., area of the first plate 41) is larger than that of the conventional lighting module 12. As such, the lighting module 4 has an effective lighting area larger than that of the conventional lighting module 12. Without the periphery region, the overall size of the lighting device 2 and the material cost thereof could be reduced. Moreover, any concern of damage caused to the periphery region would be needless.

Figure 7:
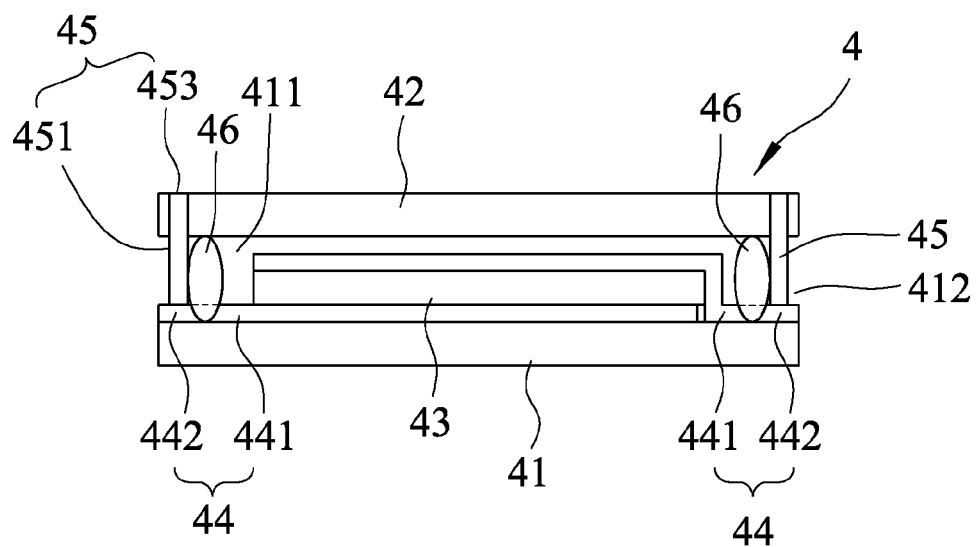
FIG. 7 is a schematic view of a second embodiment of the lighting module.
Figure 8:
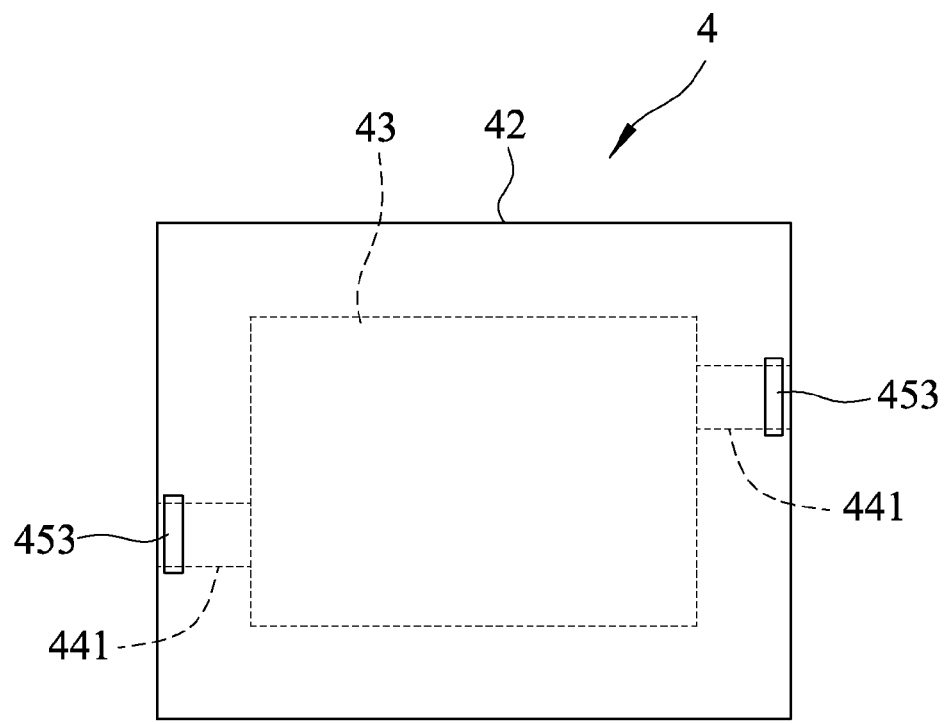
FIG. 8 is a top view of the second embodiment.

Referring to FIGS. 7 and 8, a second embodiment of the lighting module 4 according to the present invention has a structure similar to that of the first embodiment. The differences reside in the configuration of the second plate 42 and the conducting elements 45.

In this embodiment, during manufacture of the lighting module 4, the second plate 42 is drilled with two through holes, each of which is aligned with the outer portion 442 of the respective one of the electrodes 44. Silver paste is extruded into the through holes and then solidified, forming two conducting elements 45. Each of the conducting elements 45 has a main portion 451 disposed in the surrounding space 412 and in contact with the respective one of the electrodes 44, and a penetrating portion 453 extending from the main portion 451 and through a respective one of the through holes to be exposed from the second plate 42. The penetrating portion 453 of each of the conducting elements 45 could be electrically connected to the external power source for supplying electric power to the electroluminescence element 43.

When the penetrating portion 453 of each of the conducting elements 45 is electrically connected to the external power source, electric current flows through the penetrating portion 453 to the main portion 451, the outer portion 442 of the respective one of the electrodes 44, the inner portion 441 of the respective one of the electrodes 44, and finally to the electroluminescence element 43, so that the electroluminescence element 43 generates light that passes through the first plate 41.

Similar to the first embodiment, the second embodiment, having the penetrating portion 453 of the conducting elements 45, does not require a periphery region as provided in the conventional lighting module. Thus, the second embodiment has the advantages similar to those of the first embodiment.

To sum up, by virtue of the projecting portion 452 in the first embodiment and the penetrating portion 453 in the second embodiment, the drawbacks associated with the conventional lighting module 12 (see FIG. 2) could be alleviated.

While the present invention has been described in connection with what are considered the practical embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A lighting module, comprising:
    a first plate;
    a second plate spacedly confronting and being connected to said first plate, said second plate having a normal projection that falls on and substantially corresponds in size to said first plate;
    an enclosed space formed between said first and second plates;
    a surrounding space surrounding said enclosed space between said first and second plates;
    an electroluminescence element disposed in said enclosed space to generate light;
    a plurality of electrodes, each of which has an inner portion that is electrically connected to said electroluminescence element within said enclosed space, and an outer portion that is disposed in said surrounding space; and
    a plurality of conducting elements, each of which is disposed in said surrounding space, and electrically contacts said outer portion of a respective one of said electrodes, said conducting elements being exposed outwardly from at least one of said first and second plates for connection with an external power source.

2. The lighting module as claimed in claim 1, wherein each of said conducting elements is solidified silver paste disposed in said surrounding space.

3. The lighting module as claimed in claim 2, wherein each of said conducting elements has a main portion disposed in said surrounding space in contact with the respective one of said electrodes, and a projecting portion projecting outwardly from said first and second plates and said surrounding space.

4. The lighting module as claimed in claim 2, wherein each of said conducting elements has a main portion disposed in said surrounding space and in contact with the respective one of said electrodes, and a penetrating portion extending from said main portion and through said second plate to be exposed from said second plate.

5. The lighting module as claimed in claim 3, wherein said electroluminescence element includes at least one organic light-emitting diode (OLED).

6. The lighting module as claimed in claim 4, wherein said electroluminescence element includes at least one organic light-emitting diode (OLED).

7. The lighting module as claimed in claim 1, wherein said first plate is identical to said second plate in shape and dimension.

8. A lighting device, comprising:
a housing; and
at least one lighting module that is disposed in said housing and that includes
a first plate,
a second plate spacedly confronting and being connected to said first plate, said second plate having a normal projection that falls on and substantially corresponds in size to said first plate,
an enclosed space formed between said first and second plates,
a surrounding space surrounding said enclosed space between said first and second plates,
an electroluminescence element disposed in said enclosed space to generate light,
a plurality of electrodes, each of which has an inner portion that is electrically connected to said electroluminescence element within said enclosed space, and an outer portion that is disposed in said surrounding space, and
a plurality of conducting elements, each of which is disposed in said surrounding space, and electrically contacts said outer portion of a respective one of said electrodes, said conducting elements being exposed outwardly from at least one of said first and second plates for connection with an external power source.

9. The lighting device as claimed in claim 7, wherein each of said conducting elements is solidified silver paste disposed in said surrounding space.

10. The lighting device as claimed in claim 8, wherein each of said conducting elements has a main portion disposed in said surrounding space and in contact with the respective one of said electrodes, and a projecting portion projecting outwardly from said first and second plates and said surrounding space.

11. The lighting device as claimed in claim 8, wherein each of said conducting elements has a main portion disposed in said surrounding space in contact with the respective one of said electrodes, and a penetrating portion extending from said main portion and through said second plate to be exposed from said second plate.

12. The lighting device as claimed in claim 10, wherein said electroluminescence element includes at least one organic light-emitting diode (OLED).

13. The lighting module as claimed in claim 11, wherein said electroluminescence element includes at least one organic light-emitting diode (OLED).

14. The lighting module as claimed in claim 8, wherein said first plate is identical to said second plate in shape and dimension.

\* \* \* \* \*